(12) United States Patent
Lee et al.

(10) Patent No.: US 7,224,624 B2
(45) Date of Patent: May 29, 2007

(54) PAGE BUFFER FOR NONVOLATILE SEMICONDUCTOR MEMORY DEVICE AND METHOD OF OPERATION

(75) Inventors: Jin-Yub Lee, Seocho-gu (KR); Yong-Taek Jeong, Seo-gu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

(21) Appl. No.: 11/133,214

(22) Filed: May 20, 2005

(65) Prior Publication Data

US 2006/0133144 A1 Jun. 22, 2006

(30) Foreign Application Priority Data

Dec. 17, 2004 (KR) ............... 10-2004-0107934

(51) Int. Cl.
*G11C 7/10* (2006.01)
*G11C 16/06* (2006.01)

(52) U.S. Cl. ............... 365/189.05; 365/185.21; 365/185.23

(58) Field of Classification Search ......... 365/185.21, 365/185.23, 189.05
See application file for complete search history.

(56) References Cited

U.S. PATENT DOCUMENTS 5,146,427 A * 9/1992 Sasaki et al. .......... 365/189.05
5,625,780 A * 4/1997 Hsieh et al. ............. 710/316
5,734,334 A * 3/1998 Hsieh et al. ............. 340/2.2
5,796,705 A * 8/1998 Kim ..................... 710/62
5,805,503 A * 9/1998 Camarota ............ 365/189.05
5,936,890 A    8/1999 Yeom
6,031,760 A * 2/2000 Sakui et al. ........... 365/185.21
6,266,270 B1   7/2001 Nobukata
6,400,604 B2 * 6/2002 Noda .................... 365/185.12
6,473,334 B1 * 10/2002 Bailey et al. ............ 365/154
6,507,581 B1 * 1/2003 Sgammato .............. 370/381
6,580,645 B1 * 6/2003 Lin et al. ............. 365/185.23
6,925,005 B2 * 8/2005 Kawamura et al. ..... 365/185.12

FOREIGN PATENT DOCUMENTS

JP         2003-196989        7/2003

* cited by examiner

*Primary Examiner*—Amir Zarabian
*Assistant Examiner*—Ly Duy Pham
(74) *Attorney, Agent, or Firm*—Volentine & Whitt, PLLC

(57) ABSTRACT

Disclosed is a page buffer for a nonvolatile semiconductor memory device and a related method of operation. The page buffer includes a unidirectional driver between a loading latch unit used for storing a data bit in the page buffer and a bitline used to program a memory cell connected to the page buffer.

11 Claims, 6 Drawing Sheets

PAGE BUFFER FOR NONVOLATILE SEMICONDUCTOR MEMORY DEVICE AND METHOD OF OPERATION

BACKGROUND

1. Field of the Invention

The present invention relates generally to a nonvolatile semiconductor memory device. More particularly, the invention relates to a page buffer for a nonvolatile semiconductor memory device.

A claim of priority is made to Korean Patent Application 2004-0107934 filed on Dec. 17, 2004, the disclosure of which is hereby incorporated by reference in its entirety.

2. Description of the Related Art

A common method for programming a memory cell in a nonvolatile semiconductor memory device comprises electrically connecting source/drain and bulk regions of the memory cell to ground VSS and applying a high-level programming voltage (e.g., +20V) to a control gate of the memory cell by way of a wordline. Such a voltage bias condition creates Fowler-Nordheim tunneling between the bulk region and a floating gate of the memory cell, causing the memory cell to become programmed. In general, bitlines for memory cells being programmed are electrically connected to ground VSS, and bitlines for memory cells not being programmed are electrically connected to a power source voltage VCC.

Nonvolatile semiconductor memory devices often include a page buffer for loading and storing data before the data is written to a memory cell. Depending on the logic state of data stored in the page buffer, a voltage level for a bitline is selectively set to ground VSS or power source voltage VCC.

A conventional page buffer for a memory cell is illustrated in FIG. 1. Referring to FIG. 1, a page buffer 100 stores a data bit waiting to be written to a memory cell. The data bit is loaded and latched at a latch node NLAT in a loading latch unit 110. The data bit at latch node NLAT is transferred to a bitline BL in response to metal-oxide semiconductor (MOS) transistors 180 and 190 turning on. MOS transistors 180 and 190 are turned on in response their respective gate signals, namely, a bitline shielding signal BLSHF and a buffer selection signal PBSLT.

In page buffer 100, latch node NLAT is directly connected to bitline BL through MOS transistors 180 and 190. Unfortunately, this direct connection creates a problem. Since parasitic capacitance on bitline BL is significantly larger than parasitic capacitance at latch node NLAT, connecting latch node NLAT to bitline BL can cause the logic state of the data bit at latch node NLAT to become flipped rather than being transferred to bitline BL depending on data previously presented at bitline BL. This is especially true in cases where a voltage level of the previous data bit stored on bitline BL is ground VSS. In such cases, the logic state of the data bit at latch node NLAT is frequently flipped from a logic state "high" to a logic state "low".

In order to prevent the logic state of the data bit at latch node NLAT from being flipped rather than transferred to bitline BL, conventional page buffer 100 typically executes a programming operation that includes a bitline precharging step PSBP as shown in FIG. 2. The data bit at latch node NLAT is transferred to bitline BL after bitline BL is precharged to power source voltage VCC. Bitline precharging step PSBP prevents the data bit at latch node NLAT from being undesirably changed from a logic state "high" to a logic state "low".

Unfortunately, the bitline precharging step of conventional page buffer 100 decreases the speed of programming operations for semiconductor memory devices using the conventional page buffer. As a result, the precharging step of the conventional page buffer has a negative overall impact of the performance of the semiconductor memory devices. What is needed is a page buffer for a semiconductor memory device that does not have a negative impact on the semiconductor memory device's performance.

SUMMARY OF THE INVENTION

The present invention provides a page buffer for a semiconductor memory device and associated methods of operation. The page buffer prevents a voltage level apparent at a bitline from changing the logic state of a data bit stored at a latch node in a loading latch unit.

According to one embodiment of the present invention, a page buffer for a nonvolatile semiconductor memory device comprises a loading latch unit loading and storing a data bit at a latch node and a unidirectional driver receiving the data bit from the loading latch unit and driving a corresponding write data bit onto a bitline connected to a memory cell.

According to another embodiment of the present invention, a page buffer for a semiconductor memory device comprises a loading latch unit loading and storing a data bit at a latch node, and a unidirectional driver receiving the data bit from the latch node and driving a corresponding write data bit onto a bitline by way of a sensing node, wherein the bitline is connected to a memory cell. The page buffer further comprises a sensing detector flipping a logic state of the data bit stored at the latch node relative to a logic state of a data bit apparent at the sensing node, and a buffer selection unit receiving the write data bit from the unidirectional driver and sending the write data bit to the bitline by way of the sensing node in response to a buffer selection signal.

According to still another embodiment of the present invention, a method of operating a page buffer for a nonvolatile semiconductor memory device comprises loading a data bit to a latch node in a loading latch unit, and receiving the data bit from the loading latch unit and outputting a corresponding write data bit to a bitline using a unidirectional driver, wherein the bitline is connected to a memory cell.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 3:
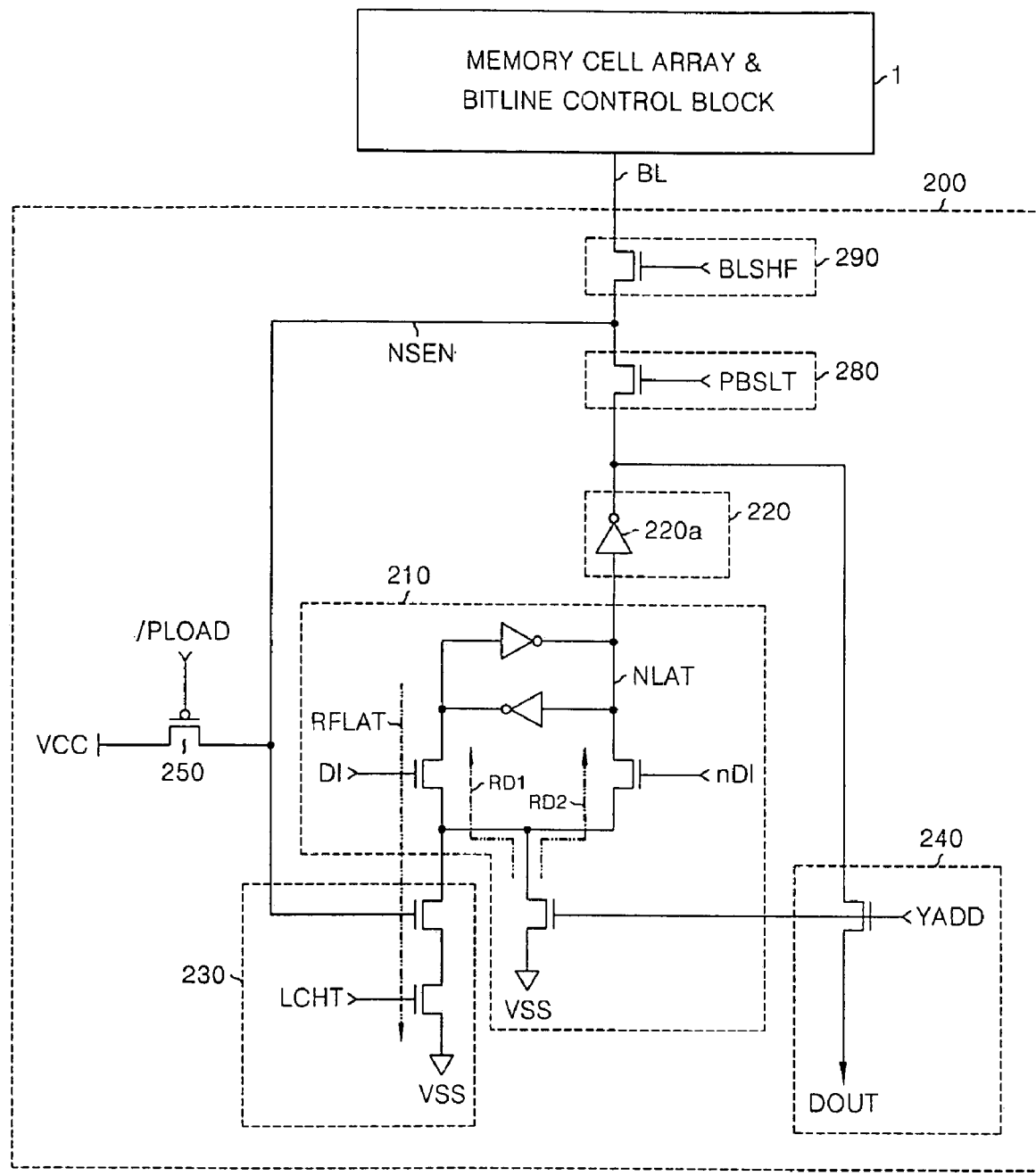
FIG. 3 is a circuit diagram illustrating a page buffer for a nonvolatile semiconductor memory device according to one embodiment of the present invention.

FIG. 3 illustrates a page buffer 200 for a nonvolatile semiconductor memory device in accordance with one embodiment of the present invention. Page buffer 200 loads and stores a data bit used for programming a memory cell (not shown). The memory cell is included in a memory cell array and bitline control block (MCABCB) 1. The data bit is loaded and stored at a latch node NLAT in page buffer 200 and a corresponding write data bit is transferred to bitline BL in order to be stored in the memory cell.

MCABCB 1 comprises bitlines for programming data in and reading data from memory cells contained therein. MCABCB 1 further comprises control circuits used to regulate voltages on the bitlines. Structural and operational features of MCABCB 1, including the bitlines and control circuits, may be variously configured in accordance with the capacity and operating conditions of the nonvolatile semiconductor memory device, and as a result, a detailed description for the structure and operation of MCABCB 1 will not be provided herein. It will be assumed, however, that bitline BL is charged to a voltage level near power source voltage VCC whenever a corresponding memory cell is in a programming inhibit state and bitline BL is charged to a voltage level near ground voltage VSS while in a programming available state (when programming a logical "0").

Page buffer 200 comprises a loading latch unit 210 and a unidirectional driver 220. Loading latch unit 210 includes latch node NLAT, where the data bit is loaded and stored before the corresponding write data bit is transferred to bitline BL by way of a sensing node NSEN. Sensing node NSEN is arranged to be electrically connected with bitline BL between unidirectional driver 220 and bitline BL. Where the memory cell is to be programmed with a logical "0", a data bit having a logic state "H" (or "high") is loaded and stored at latch node NLAT by way of a first data loading path RD1. Otherwise, where the memory cell is to be set to the programming inhibit state, a data bit having a logic state "L" (or "low") is loaded and stored at latch node NLAT by way of a second data loading path RD2.

Unidirectional driver 220 drives the write data bit corresponding to the data bit stored at latch node NLAT onto bitline BL. Where the memory cell is to be programmed with logical "0", unidirectional driver 220 sets the voltage level of bitline BL to ground VSS. Otherwise, where the memory cell is to be set to the programming inhibit state, unidirectional driver 220 sets the voltage level of bitline BL to power source voltage VCC.

Unidirectional driver 220 is designed to operate in a single unidirectional path going in a direction from latch node NLAT toward bitline BL. As a result, it prevents the logic state of a data bit stored at latch node NLAT from being flipped due to electrical conditions of bitline BL.

According to the embodiment of the invention illustrated in FIG. 3, unidirectional driver 220 includes an inverter 220a that receives a data bit stored at latch node NLAT and sends a corresponding output to bitline BL.

Page buffer 200 typically further comprises a sensing detector 230 and an output driver 240. Sensing detector 230 flips the logic state of a data bit at sensing node NSEN (i.e. the logic state of a data bit at latch node NLAT) during a read operation relative to a logic state of a data bit at bitline BL. According to this embodiment, where the data bit at bitline BL has a logic state "H" and a read latching signal LCHT has a logic state "H", a flip latching path is formed to flip the logic state of the data bit at latch node NLAT from logic state "L" to logic state "H". A positive metal oxide semiconductor (PMOS) transistor 250 precharges sensing node NSEN up to power source voltage VCC in response to a precharge signal /PLOAD.

Output driver 240 outputs a data bit on a data output line DOUT during a read operation. The logic state of the data bit output by output driver 240 is determined by the logic state of the data bit stored at latch node NLAT. Typically, output driver 240 sends a data bit output by unidirectional driver 220 to data output line DOUT in response to a column address YADD. As such, the data bit sent to data output line DOUT is an indication of the logic state of a data bit stored in a selected memory cell, i.e. the logic state of the data bit stored at latch node NLAT.

According to the embodiment illustrated in FIG. 3, latch node NLAT is electrically isolated from data output line DOUT. This effectively prevents the logic state of the data bit stored at latch node NLAT from flipping due to electrical conditions of data output line DOUT.

Page buffer 200 further comprises a buffer selection unit 280. Buffer selection unit 280 transfers a data bit from unidirectional driver 230 to bitline BL by way of sensing node NSEN in response to buffer selection signal PBSLT.

A bitline shielding unit 290 controls a connection between bitline BL and sensing node NSEN. Bitline shielding unit 290 reduces coupling noise that may occur between sensing nodes of adjacent page buffers (not shown).

In summary, unidirectional driver 220 included in page buffer 200 prevents a voltage apparent at bitline BL from altering the logic state of a data bit stored at latch NLAT during a programming operation for a memory cell. Furthermore, unidirectional driver 220 drives a write data bit onto bitline BL, where the write data bit corresponds to a data bit stored at latch node NLAT. As a result, during a programming operation involving page buffer 200, a bitline precharging operation is not needed to charge bitline BL up to power source voltage VCC before transferring a data bit to bitline BL.

Figure 2:
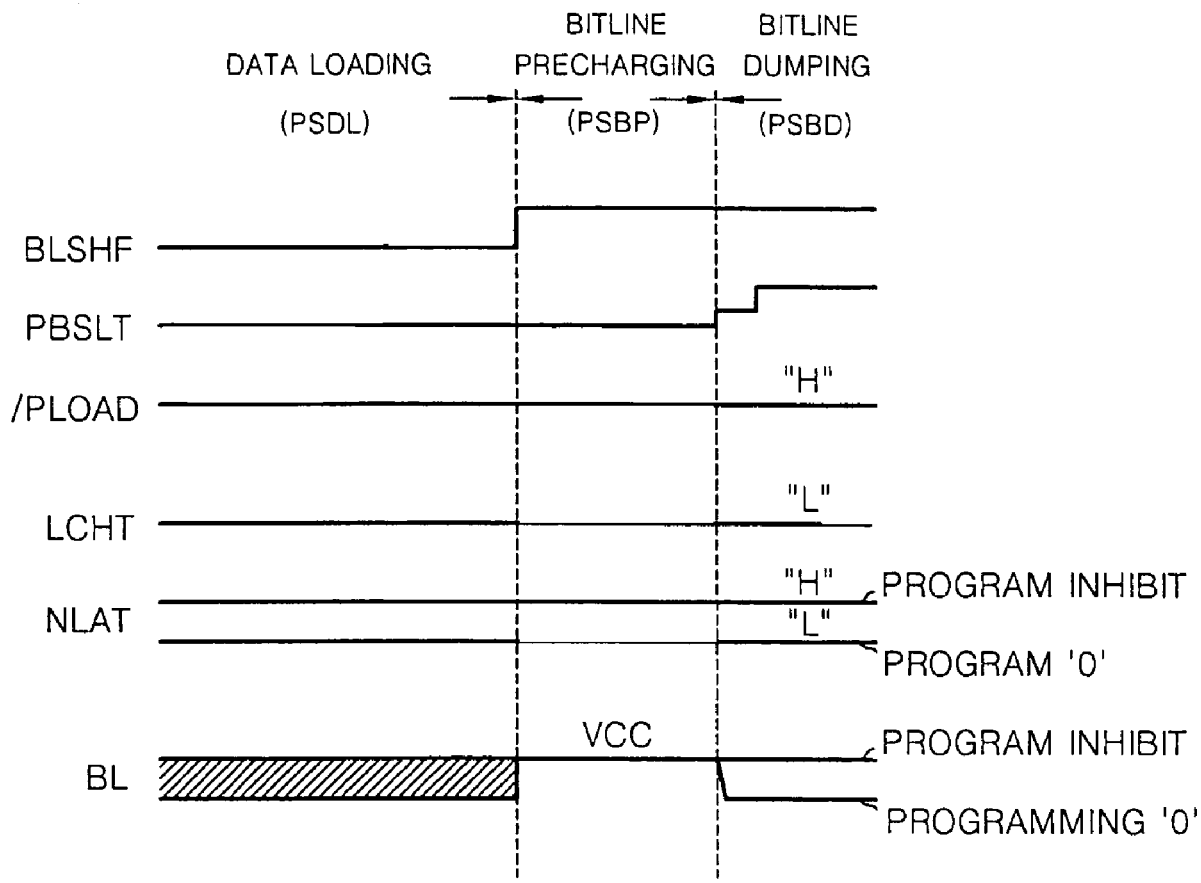
FIG. 2 is a timing diagram showing a programming operation involving the page buffer shown in FIG. 1.
Figure 4:
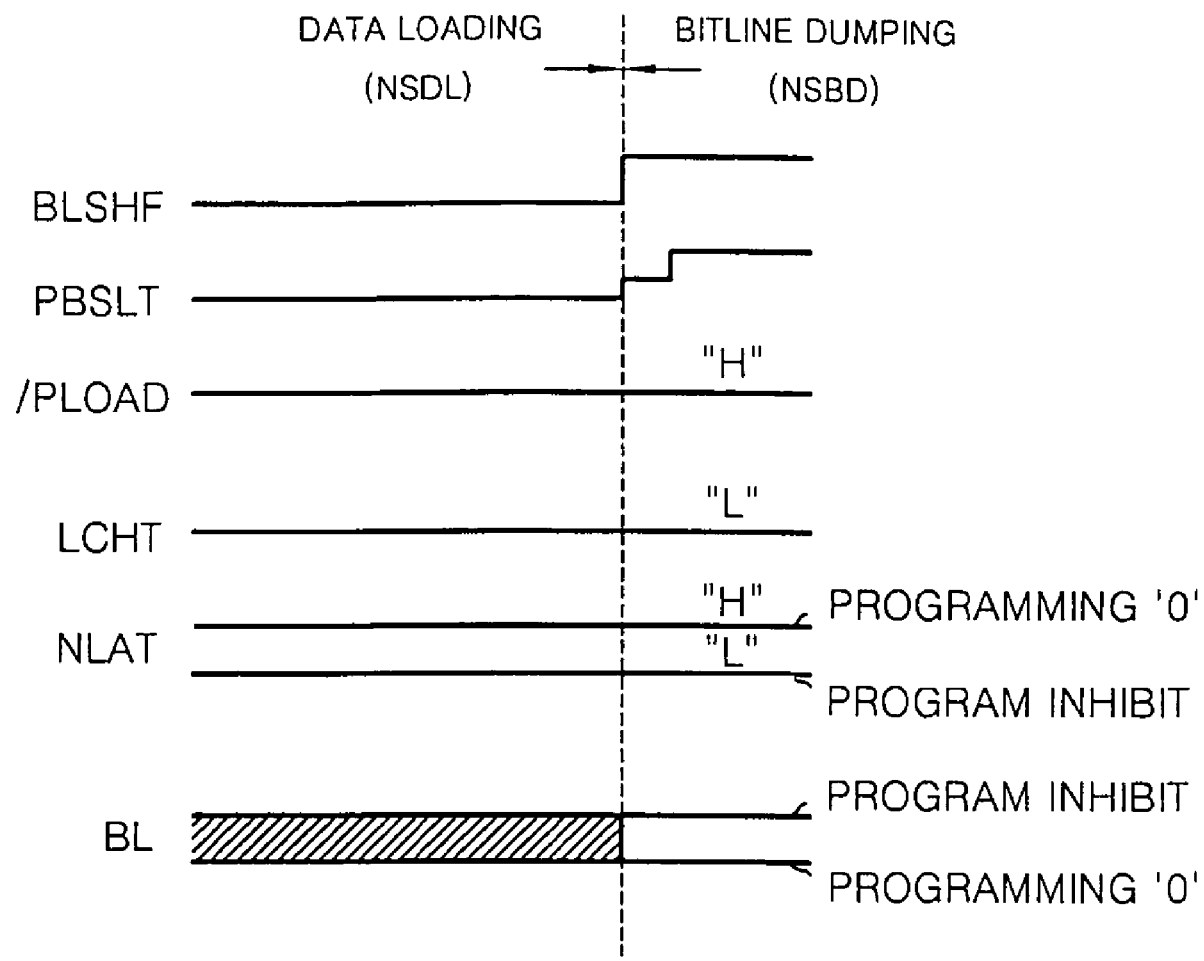
FIG. 4 is a timing diagram showing a programming operation involving the page buffer illustrated in FIG. 3.

FIG. 4 is a timing diagram showing a programming operation involving page buffer 220. The timing diagram in FIG. 4, excludes the bitline precharging step shown in FIG. 2. Referring to FIG. 4, a data loading step NSDL is first executed and then a data dumping step NSBD is executed. In data loading step NSDL, a data bit is loaded onto latch node NLAT. The data bit loaded onto latch node NLAT corresponds to a data bit which is to be written to bitline BL. In data dumping step NSBD, a data bit corresponding to the data bit stored at latch node NLAT is driven onto bitline BL.

By using page buffer 200 and associated methods of operation, the time required to perform programming operations for a nonvolatile semiconductor memory device is remarkably reduced in comparison with cases where a conventional page buffer requiring a bitline precharging step is used. As a result, the overall operation speed of the nonvolatile semiconductor memory device is dramatically increased.

Figure 5:
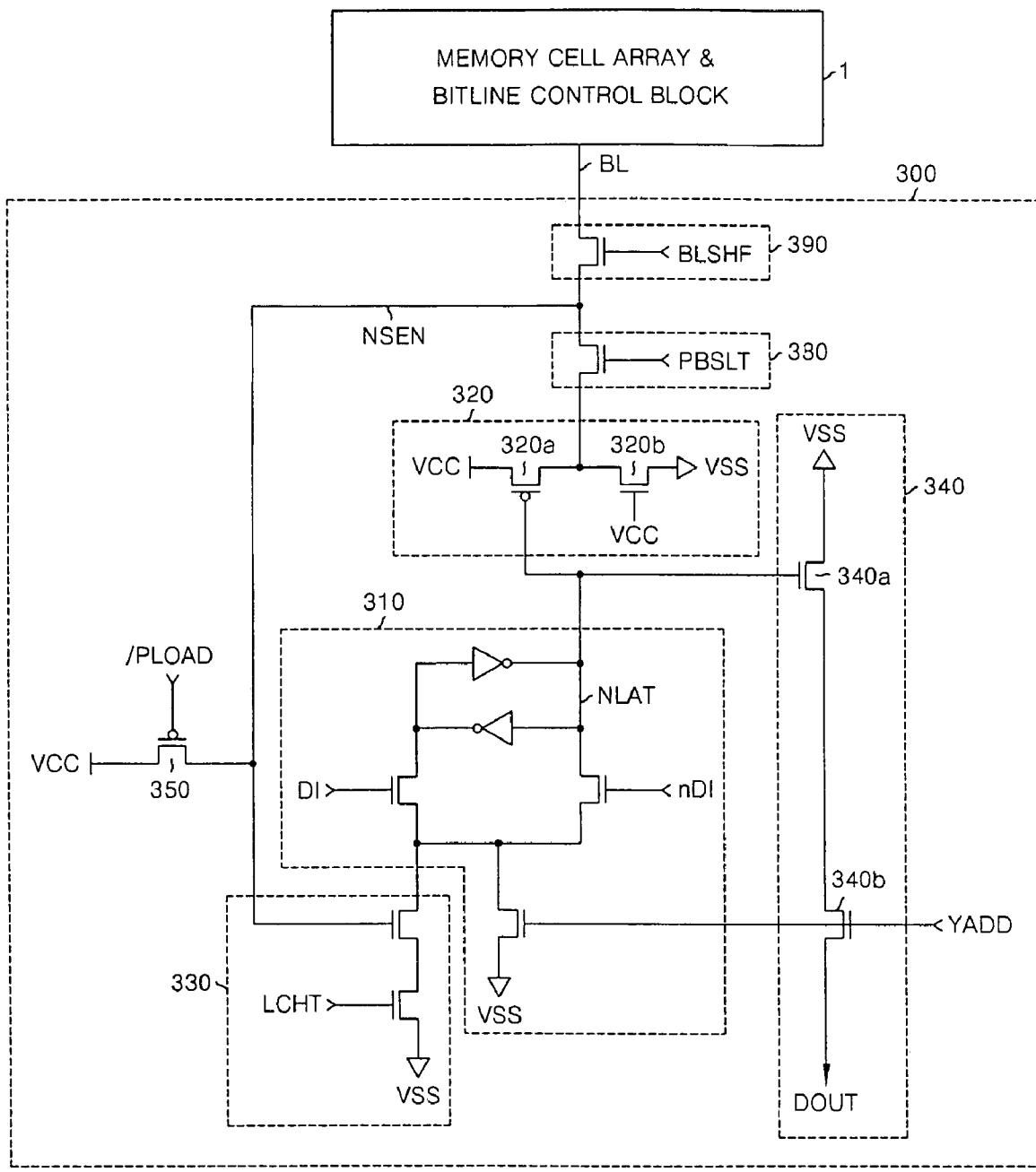
FIG. 5 is a circuit diagram illustrating a page buffer for a nonvolatile semiconductor memory device according to another embodiment of the present invention; and, FIG. 6 a circuit diagram illustrating a page buffer for a nonvolatile semiconductor memory device according to still another embodiment of the present invention.

FIG. 5 illustrates a page buffer 300 for a nonvolatile semiconductor memory device according to another embodiment of the present invention. Page buffer 300 shown in FIG. 5 is similar to page buffer 200 shown in FIG. 3, except for a unidirectional driver 320 and an output driver 340 which are different from unidirectional driver 220 and output driver 240 shown in FIG. 3. Unidirectional driver 320 comprises a PMOS transistor 320a gated by a voltage apparent at latch node NLAT and a negative metal oxide semiconductor (NMOS) transistor 320b gated by power source voltage VCC. Output driver 340 comprises a NMOS transistor 340a gated by a voltage apparent at latch node NLAT and an NMOS transistor 340b gated by a column address YADD. Here, NMOS transistor 340b is designed to have very low conductivity.

The functions of unidirectional driver 320 and output driver 340 are similar to those of unidirectional driver 220 and output driver 240 in FIG. 3, respectively. Hence, the function of these elements will not be described in further detail.

Figure 6:
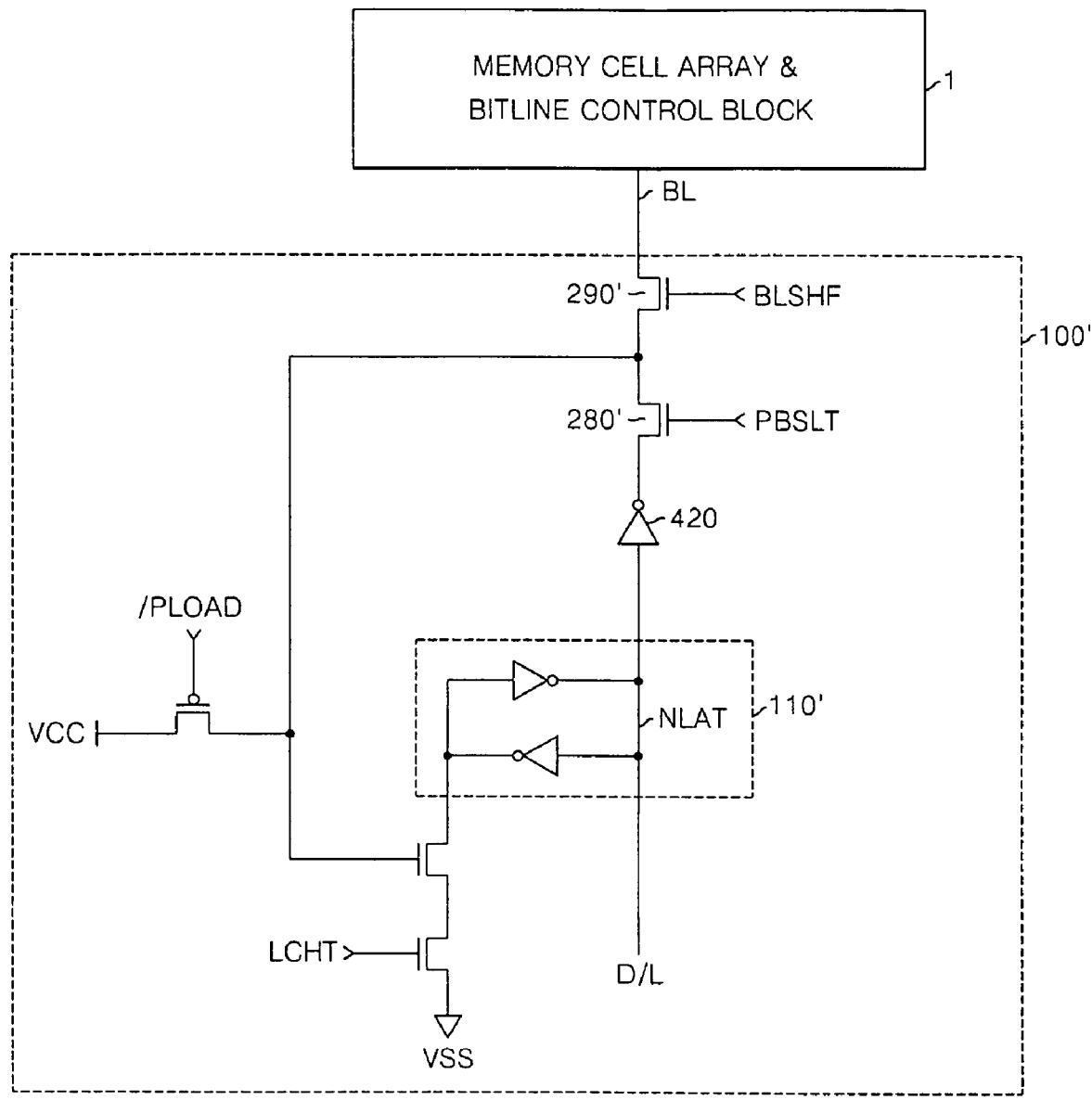

FIG. 6 is a circuit diagram illustrating a page buffer for a nonvolatile semiconductor memory device according to still another embodiment of the present invention. Referring to FIG. 6, a page buffer 100' adds upon page buffer 100 shown in FIG. 1 to include a unidirectional driver 420 between latch node NLAT and an NMOS transistor 280' gated by buffer selection signal PBSLT. Unidirectional driver 420 typically comprises an inverter.

Figure 1:
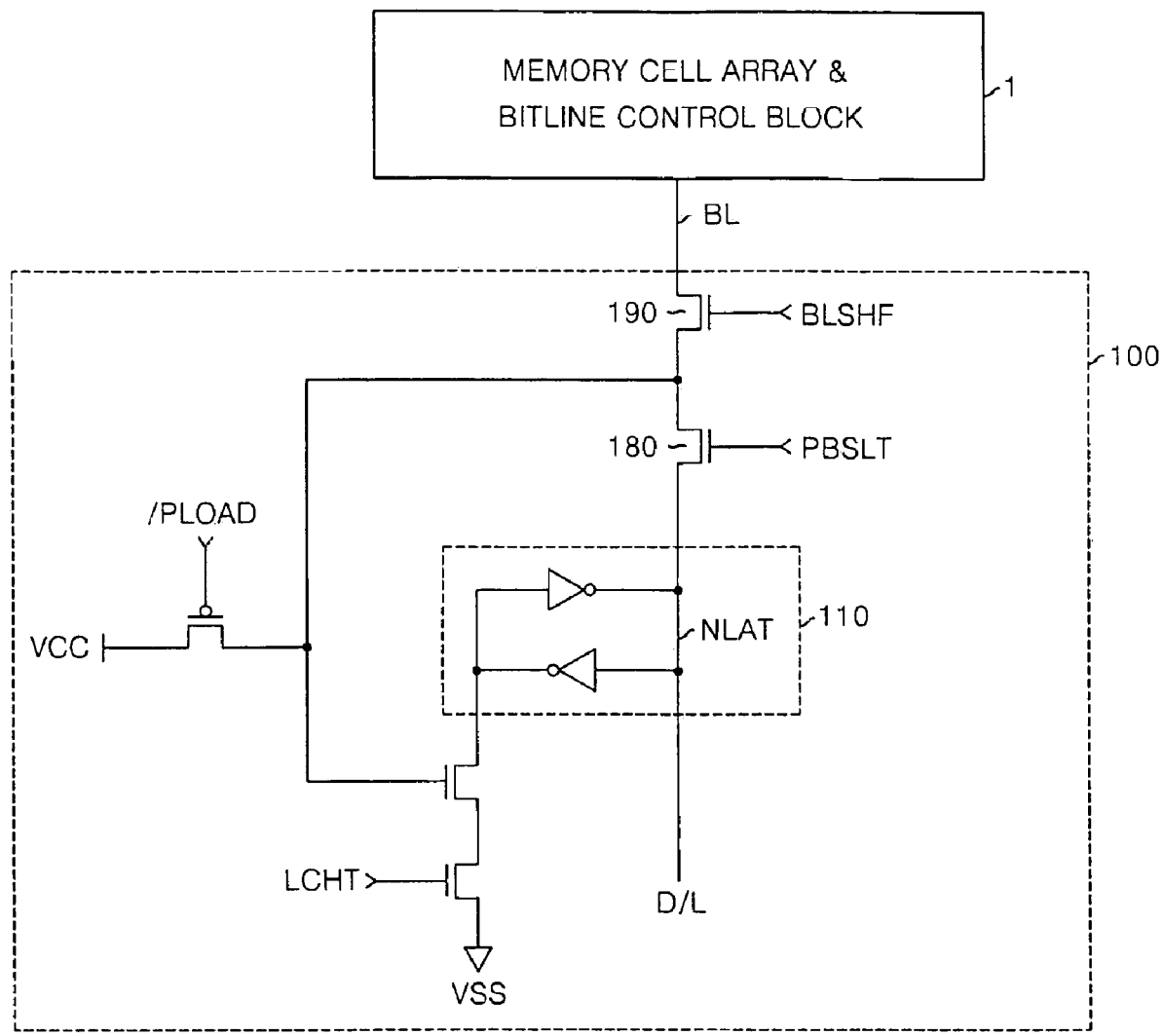
FIG. 1 is a circuit diagram of a conventional page buffer.

The functionality of page buffer 100' in FIG. 6 is similar to that of page buffer 100 in FIG. 1, and hence additional description thereof will be omitted.

As previously described, a page buffer according to the present invention comprises an embedded unidirectional driver. The unidirectional driver prevents a bitline voltage level from changing a logic state of a data bit stored at a latch node when a programming operation is performed. As a result, a programming operation involving the page buffer of the present invention does not require a bitline precharging operation to boost a bitline to a predetermined voltage level before conducting a bitline dumping operation. As a result, the page buffer and a related method of operation effectively reduce the time required to program data. This in turn remarkably improves overall operation speed of nonvolatile semiconductor memory devices which incorporate the page buffer. In addition, it also reduces current consumption on precharging bitlines.

What is claimed is:

1. A page buffer for a nonvolatile semiconductor memory device, the page buffer comprising:
   a loading latch unit adapted to load and store a data bit in a latch node;
   a unidirectional driver adapted to receive the data bit from the loading latch unit and drive a corresponding write data bit onto a bitline connected to a memory cell, wherein the unidirectional driver is connected between the loading latch unit and the bitline such that during a program operation of the memory cell, the data bit stored in the latch node is prevented from being flipped in response to a voltage level apparent on the bitline; and
   a sensing detector adapted to flip a logic state of the data bit stored in the latch node according to a voltage level apparent on the bitline, the sensing detector being enabled in response to a read latch signal.

2. The page buffer of claim 1, wherein the unidirectional driver comprises an inverter.

3. The page buffer of claim 2, further comprising:
   an output driver adapted to receive a data bit output by the unidirectional driver and provide a corresponding data bit to a data output line.

4. The page buffer of claim 1, further comprising:
   a buffer selection unit adapted to receive a data bit from the unidirectional driver and selectively provide the data bit to the bitline in response to a buffer selection signal.

5. A page buffer for a nonvolatile semiconductor memory device, the page buffer comprising:
   a loading latch unit adapted to load and store a data bit in a latch node;
   a unidirectional driver adapted to receive the data bit from the latch node and driving a corresponding write data bit onto a bitline by way of a sensing node, wherein the bitline is connected to a memory cell, wherein the unidirectional driver is connected between the loading latch unit and the bitline such that during a program operation of the memory cell, the data bit stored in the latch node is prevented from being flipped in response to a voltage level apparent on the bitline;
   a sensing detector adapted to flip a logic state of the data bit stored at the latch node according to a voltage level apparent at the sensing node, the sensing detector being enabled in response to a read latch signal; and,
   a buffer selection unit receiving the write data bit from the unidirectional driver and sending the write data bit to the bitline by way of the sensing node in response to a buffer selection signal.

6. The page buffer of claim 5, wherein the unidirectional driver comprises an inverter receiving the data bit stored in the latch node and sending an output to the buffer selection unit.

7. The page buffer of claim 6, further comprising:
   an output driver receiving the output from the unidirectional driver and sending a corresponding data bit to a data output line.

8. A method of operating a page buffer for a nonvolatile semiconductor memory device, the method comprising:
   loading a data bit to a latch node in a loading latch unit;
   receiving the data bit from the loading latch unit and outputting a corresponding write data bit to a bitline using a unidirectional driver, wherein the bitline is connected to a memory cell and the unidirectional driver is connected between the loading latch unit and the bitline such that during a program operation of the memory cell, the data bit loaded to the latch node is prevented from being flipped in response to a voltage level apparent on the bitline;
   flipping the data bit loaded to the latch node according to a voltage level of the bitline while a read latch signal is activated.

9. The method of claim 8, wherein the unidirectional driver comprises an inverter.

10. The method of claim 8, further comprising:
    receiving the write data bit from the unidirectional driver and sending the write data bit to the bitline by way of a sensing node in response to a buffer selection signal.

11. The method of claim 8, further comprising:
    sending an output from the unidirectional driver to a data output line.

* * * * *